US011640840B2

(12) United States Patent
SeyedzadehDelcheh et al.

(10) Patent No.: US 11,640,840 B2
(45) Date of Patent: May 2, 2023

(54) VICTIM ROW REFRESHES FOR MEMORIES IN ELECTRONIC DEVICES

(71) Applicant: Advanced Micro Devices, Inc., Santa Clara, CA (US)

(72) Inventors: SeyedMohammad SeyedzadehDelcheh, Bellevue, WA (US); Gabriel H. Loh, Bellevue, WA (US)

(73) Assignee: Advanced Micro Devices, Inc., Santa Clara, CA (US)

(*) Notice: Subject to any disclaimer, the term of this patent is extended or adjusted under 35 U.S.C. 154(b) by 0 days.

(21) Appl. No.: 17/360,958

(22) Filed: Jun. 28, 2021

(65) Prior Publication Data

US 2022/0415384 A1  Dec. 29, 2022

(51) Int. Cl.

| G11C 11/40 | (2006.01) |
|---|---|
| G11C 11/06 | (2006.01) |
| G11C 11/4078 | (2006.01) |
| G11C 11/408 | (2006.01) |
| G06F 12/1018 | (2016.01) |
| G06F 3/06 | (2006.01) |
| G11C 11/406 | (2006.01) |
| G11C 11/4076 | (2006.01) |

(52) U.S. Cl.
CPC .... *G11C 11/40622* (2013.01); *G11C 11/4076* (2013.01); *G11C 11/40603* (2013.01); *G11C 11/40615* (2013.01)

(58) Field of Classification Search
None
See application file for complete search history.

(56) References Cited

U.S. PATENT DOCUMENTS

| 9,536,586 B2* | 1/2017 | Sohn ................. G11C 11/4076 |
|---|---|---|
| 10,950,292 B1* | 3/2021 | SeyedzadehDelcheh .................... G11C 11/4078 |
| 2015/0109871 A1* | 4/2015 | Bains ................. G11C 11/40611 365/222 |
| 2021/0020262 A1* | 1/2021 | Penney ............. G11C 11/40611 |
| 2022/0091784 A1* | 3/2022 | Brandl .................. G06F 3/0652 |

OTHER PUBLICATIONS

Seyedzadehdelcheh M., U.S. Appl. No. 16/710,424, filed Dec. 2019, unpublished as of Jun. 28, 2021.
Seyedzadehdelcheh M. et al., U.S. Appl. No. 16/902,204, filed Jun. 2020, unpublished as of Jun. 28, 2021.
D. Kim et al., Architectural Support for Mitigating Row Hammering in DRAM Memories, IEEE Computer Architecture Letters, Apr. 2014.

(Continued)

*Primary Examiner* — Ly D Pham
(74) *Attorney, Agent, or Firm* — Park, Vaughan, Fleming & Dowler LLP

(57) ABSTRACT

An electronic device includes a memory having a plurality of memory rows and a memory refresh functional block that performs a victim row refresh operation. For the victim row refresh operation, the memory refresh functional block selects one or more victim memory rows that may be victims of data corruption caused by repeated memory accesses in a specified group of memory rows near each of the one or more victim memory rows. The memory refresh functional block then individually refreshes each of the one or more victim memory rows.

21 Claims, 5 Drawing Sheets

(56) References Cited

OTHER PUBLICATIONS

Y Kim et al., "Flipping bits in memory without accessing them: An experimental study of DRAM disturbance errors," 2014 ACM/IEEE 41st International Symposium on Computer Architecture (ISCA), 2014.
S. Zhou et al., "An ultra-low power CMOS random number generator," Solid-state Electronics 52, 2008.
Z. Aweke et al., "ANVIL: Software-Based Protection Against Next-Generation Rowhammer Attacks," Operating Systems Review 50, 2016.

* cited by examiner

VICTIM ROW REFRESHES FOR MEMORIES IN ELECTRONIC DEVICES

BACKGROUND

Related Art

Many electronic devices include processors that perform various operations and memories that store data for the operations (e.g., inputs or results of operations, instructions, etc.). For example, some electronic devices include memories implemented using double data rate dynamic random access memory (DDR DRAM) memory circuitry. In more recently manufactured memories, the memory circuitry is fabricated with sufficiently small feature sizes that memory accesses (i.e., writes, reads, etc.) in parts of the memory circuitry (e.g., in memory rows) can effect data stored in nearby memory circuitry. This "crosstalk" phenomenon occurs because the memory circuitry includes physically small and closely located data storage elements and electromagnetic effects associated with memory accesses in given storage elements can alter data that is stored in nearby storage elements. Crosstalk can cause data stored in storage elements in the memory circuitry to change state (e.g., from a logical high value to a logical low value or vice versa), which renders the data stored in the storage elements incorrect.

In some cases, malicious entities (e.g., hackers) use crosstalk in deliberate attempts to corrupt data stored in memories in electronic devices. For example, using a technique sometimes called "row hammering," a malicious entity may repeatedly write data to one or more memory rows in the memory circuitry in an attempt to alter, and thereby corrupt, data stored in a nearby victim memory row. When row hammering is successful, an electronic device can experience undesirable operation or outright failures based on using corrupted data.

BRIEF DESCRIPTION OF THE FIGURES

Throughout the figures and the description, like reference numerals refer to the same figure elements.

DETAILED DESCRIPTION

Figure 1:
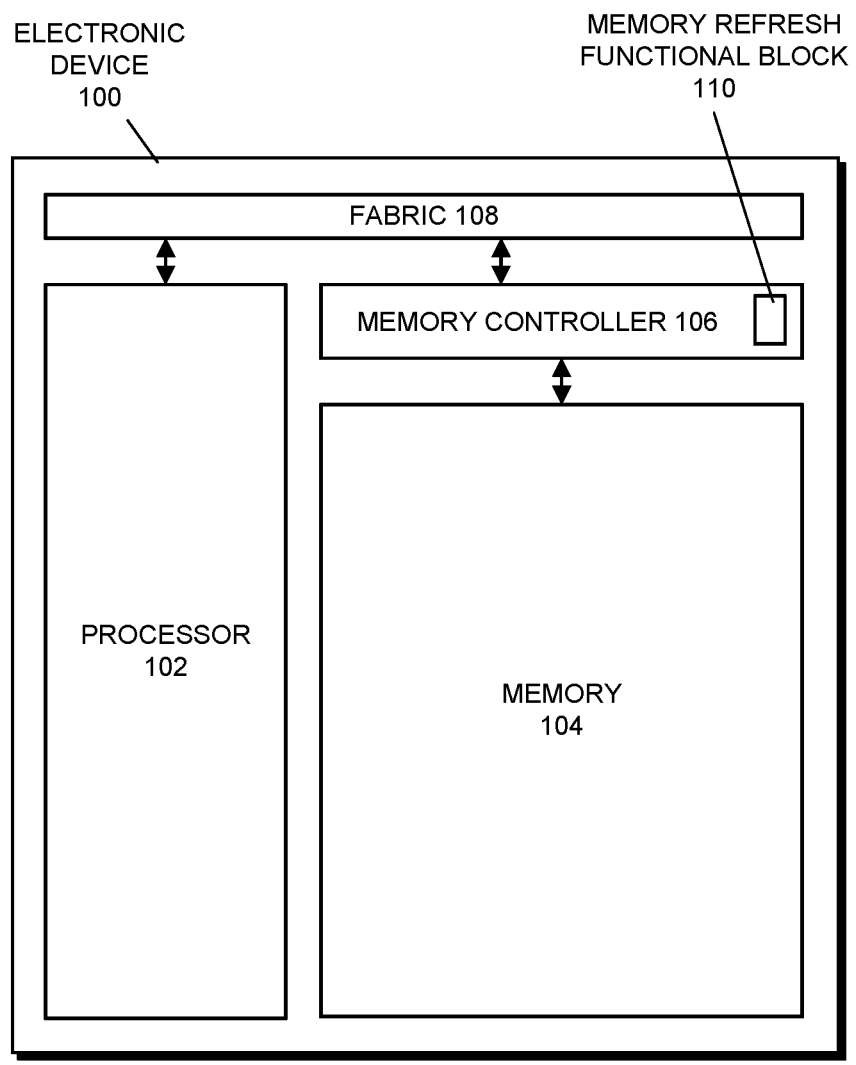
FIG. 1 presents a block diagram illustrating an electronic device in accordance with some embodiments.

The following description is presented to enable any person skilled in the art to make and use the described embodiments and is provided in the context of a particular application and its requirements. Various modifications to the described embodiments will be readily apparent to those skilled in the art, and the general principles described herein may be applied to other embodiments and applications. Thus, the described embodiments are not limited to the embodiments shown, but are to be accorded the widest scope consistent with the principles and features described herein.

Terminology

In the following description, various terms are used for describing embodiments. The following is a simplified and general description of some of the terms. Note that these terms may have significant additional aspects that are not recited herein for clarity and brevity and thus the description is not intended to limit these terms.

Functional block: functional block refers to a set of interrelated circuitry such as integrated circuit circuitry, discrete circuitry, etc. The circuitry is "interrelated" in that circuit elements in the circuitry share at least one property. For example, the circuitry may be included in, fabricated on, or otherwise coupled to a particular integrated circuit chip, substrate, circuit board, or portion thereof, may be involved in the performance of specified operations (e.g., computational operations, control operations, memory operations, etc.), may be controlled by a common control element and/or a common clock, etc. The circuitry in a functional block can have any number of circuit elements, from a single circuit element (e.g., a single integrated circuit logic gate or discrete circuit element) to millions or billions of circuit elements (e.g., an integrated circuit memory). In some embodiments, functional blocks perform operations "in hardware," using circuitry that performs the operations without executing program code.

Data: data is a generic term that indicates information that can be stored in memories and/or used in computational, control, and/or other operations. Data includes information such as actual data (e.g., results of computational or control operations, outputs of processing circuitry, inputs for computational or control operations, variable values, sensor values, etc.), files, program code instructions, control values, variables, and/or other information.

Memory accesses: memory accesses, or, more simply, accesses, include interactions that can be performed for, on, using, and/or with data stored in memory during which data is written to/stored in storage elements (e.g., capacitors, etc.) in the memory. For example, accesses can include writes or stores of data to memories, invalidations or deletions of data in memories, etc. In some cases, reads of memory are considered memory accesses, such as when reading involves destructively reading data from storage elements in memory that is subsequently re-written to the storage elements in the memory.

Overview

In the described embodiments, an electronic device includes an integrated circuit memory that is used for storing data for use by other functional blocks in the electronic device (e.g., a processor, etc.). The memory includes memory circuitry having storage elements for storing the data. For example, in some embodiments, the memory circuitry is or includes fifth-generation double data rate dynamic random access memory (DDR5 DRAM) circuitry in which capacitors serve as the storage elements. The memory circuitry is arranged in a memory array that includes N memory rows, each memory row including memory circuitry with storage elements for storing Mbytes of data (e.g., N=524,288 and M=8 kiB). The memory circuitry is susceptible to "crosstalk," which is a phenomenon by which memory accesses—and particularly repeated memory accesses—in memory rows can alter data stored in nearby memory rows. Crosstalk occurs due to a combination of small integrated circuit feature sizes and close proximity of storage elements in the memory rows and electromagnetic effects associated with memory accesses. As an example of crosstalk, a storage element in a given memory row storing a logical high value (e.g., substantially VDD) can be drained of electrical charge when logical low values (e.g., substantially VSS) are repeatedly stored in storage elements in nearby memory rows—or vice versa. Malicious entities can use crosstalk in a technique called "row hammering" to deliberately corrupt data stored in memory rows in the memory. For row hammering, a malicious entity repeatedly writes data to one or more memory rows near a victim memory row in an attempt to alter data stored in the victim memory row.

In the described embodiments, a memory refresh functional block in the electronic device performs a victim row refresh operation for avoiding the corruption of data stored in the memory due to row hammering. Generally, for the victim row refresh operation, the memory refresh functional block finds victim memory rows that may experience data corruption due to repeated memory accesses in nearby memory rows and individually refreshes the victim memory rows. More specifically, for the victim row refresh operation, the memory refresh functional block first finds candidate memory rows for which one or more adjacent/directly neighboring memory rows have experienced more than an access threshold worth of memory accesses. When such a candidate memory row is found, the memory refresh functional block checks a summation of memory accesses for a specified group of memory rows near that candidate memory row to determine if the summation exceeds a group access threshold. When the summation exceeds the group access threshold, the memory refresh functional block determines that that candidate memory row is a victim memory row that may be experiencing a row hammering attack. The memory refresh functional block therefore selects the candidate memory row as a victim memory row. The memory refresh functional block then individually refreshes data stored in the victim memory row. In other words, the memory refresh functional block recharges, rewrites, or otherwise restores existing data stored in the storage elements in the victim memory row in order to avoid undesired changes in the existing data due to the possible row hammering attack. Note that the memory refresh functional block only refreshes the victim memory row itself (i.e., only refreshes a single memory row) during the victim row refresh operation.

In some embodiments, the memory refresh functional block keeps track of memory accesses in memory rows in a memory access count record that is used for the victim row refresh operation. The memory access count record includes a number of entries, each entry being useable for storing an identifier for a memory row as well as a count of accesses in that memory row (or other information for determining a number of accesses). When a memory access occurs, assuming that the memory access is to be recorded in the memory access count record, a corresponding record is added to the memory access record with an initial count value—or a count value in an existing record is increased. The access counts from the memory access count record are then used for finding candidate memory rows and determining victim memory rows during a victim row refresh operation. For example, the access counts for respective memory rows can be compared to the access threshold and can be summed to be compared to the group access threshold during the victim row refresh operation. In some embodiments, the memory access count record includes fewer entries than there are rows in the memory and therefore the entries in the memory access count record may become full of information about memory accesses. In these embodiments, in an effort to keep current and useful information in the memory access count record, existing information in entries in the memory access count record can be overwritten by newer information.

In some embodiments, the memory refresh functional block sorts access counts from the memory access count record before using the access counts in the victim row refresh operation. That is, the memory refresh functional block sorts the memory access count record so that the entries themselves are organized in a specified order by access count—or so that a reference to the entries (e.g., a table of pointers, etc.) indicates the specified order. The memory refresh functional block can then use one or more of the highest access counts from the sorted entries for the victim row refresh operation. For example, in some embodiments, the memory refresh functional block uses only the single highest access count for the victim row refresh operation. As another example, in some embodiments, the memory refresh functional block uses a specified number of the highest access counts and/or uses all access counts in the memory access count record that exceed an access threshold for the victim row refresh operation. In these embodiments, during a given victim row refresh operation, the memory refresh functional block may select and individually refresh each of two or more respective victim memory rows.

In some embodiments, the above-described victim row refresh operation is performed two or more times—and may be performed periodically. For example, in some embodiments, the memory refresh functional block commences a victim row refresh operation at least once during each refresh window in a sequence of refresh windows (each refresh window being W ms in length). As another example, in some embodiments, the memory refresh functional block commences a victim row refresh operation each time that a request to commence a victim row refresh operation is received from another functional block. As yet another example, in some embodiments, the memory refresh functional block itself monitors one or more operating conditions and commences a victim row refresh operation each time that a specified operating condition is determined to have occurred (e.g., a given number of memory accesses or rate of memory accesses, an event, etc.).

By refreshing individual victim memory rows, the described embodiments help to protect data in stored in victim memory rows from row hammering attacks. Because the described embodiments refresh individual victim memory rows, the described embodiments are able to offer protection from the row hammering attacks for less cost in terms of electrical power consumption, memory busyness, heat generated, etc. than in existing systems. In addition, because the described embodiments use the above-described thresholds (i.e., the access threshold and the group access threshold) to select victim memory rows to be refreshed, the described embodiments avoid unnecessarily performing victim memory row refreshes in situations where such refreshes are less likely to prevent data corruption. The efficient protection of the data that is stored in memory helps to ensure the correct operation of the electronic device, which improves user satisfaction with the electronic device.

Electronic Device

FIG. 1 presents a block diagram illustrating electronic device 100 in accordance with some embodiments. As can be seen in FIG. 1, electronic device 100 includes processor 102, memory 104, memory controller 106, and fabric 108. Processor 102, memory 104, memory controller 106, and fabric 108 are all implemented in "hardware," i.e., using corresponding integrated circuitry, discrete circuitry, and/or devices. For example, in some embodiments, processor 102, memory 104, memory controller 106, and fabric 108 are implemented in integrated circuitry on one or more semiconductor chips, are implemented in a combination of integrated circuitry on one or more semiconductor chips in combination with discrete circuitry and/or devices, or are implemented in discrete circuitry and/or devices.

In the described embodiments, processor 102, memory 104, memory controller 106, and/or fabric 108 perform a victim row refresh operation for refreshing data in victim memory rows that may be experiencing row hammering attacks. In some embodiments, processor 102, memory 104, memory controller 106, and/or fabric 108 perform the victim row refresh operation "in hardware." For example, in some embodiments, processor 102, memory 104, memory controller 106, and/or fabric 108 include circuitry having integrated circuits, discrete circuit elements, and/or devices that perform respective parts of the described operations.

Processor 102 is a functional block that performs computational, memory access, control, and/or other operations in electronic device 100. For example, in some embodiments, processor 102 is or includes one or more central processing unit (CPU) cores, graphics processing unit (GPU) cores, embedded processors, application specific integrated circuits (ASICs), microcontrollers, and/or other functional blocks.

Memory 104 is a functional block that is used for storing data for other functional blocks in electronic device 100. For example, in some embodiments, memory 104 is or is part of a "main" memory in electronic device 100. Memory 104 includes memory circuitry for storing data and control circuitry for handling accesses of data stored in the memory circuitry. Memory 104 is described in more detail below.

Memory controller 106 is a functional block that performs operations for handling communications between other functional blocks in electronic device 100 (e.g., processor 102, an input-output hub (not shown), etc.) and memory 104. For example, in some embodiments, memory controller 106 receives and processes memory access requests from the other functional blocks in electronic device 100 (e.g., enforcing timing and/or ordering requirements, avoiding conflicts, etc.).

Memory controller 106 includes memory refresh functional block 110. In some embodiments, memory refresh functional block 110 performs victim row refresh operations for protecting rows of memory from row hammering attacks. For example, memory refresh functional block 110 may identify victim memory rows in memory 104 that may be susceptible to data corruption caused by row hammering attacks and individually refresh each of the victim memory rows.

Fabric 108 is a functional block that performs operations for communicating information (e.g., commands, data, control signals, and/or other information) between functional blocks and devices in electronic device 100. For example, in some embodiments, fabric 108 is a system bus or memory bus used by functional blocks for accessing data in memory 104 and/or communicating with one another. Fabric 108 includes some or all of communication paths (e.g., busses, wires, guides, etc.), controllers, switches, routers, etc. that are used for communicating the information. In some embodiments, in addition to fabric 108, communication paths are coupled between the functional blocks in electronic device 100 as shown by arrow-headed lines between the functional blocks. Communication paths include one or more routes, busses, wires, guides, and/or other connections possibly along with controllers, fabric elements (e.g., switches, routers, etc.), etc. The communication paths are used for carrying commands, data, control signals, and/or other information between functional blocks.

Although electronic device 100 is shown in FIG. 1 with a particular number and arrangement of functional blocks and devices, in some embodiments, electronic device 100 includes different numbers and/or arrangements of functional blocks and devices. For example, in some embodiments, electronic device 100 includes a different number of processors. As another example, in some embodiments, fabric 108 and/or the other communications paths are arranged differently. As another example, in some embodiments, some or all of memory refresh functional block 110 is located outside of memory controller 106. For instance, in some embodiments, some or all of memory refresh functional block 110 is located in memory 104 and/or processor 102, memory refresh functional block 110 is itself a separate functional block, etc. Generally, in the described embodiments, electronic device 100 includes sufficient numbers and/or arrangements of functional blocks to perform the operations herein described.

Electronic device 100 as shown in FIG. 1 is simplified for illustrative purposes. In some embodiments, however, electronic device 100 includes additional or different elements and mechanisms for performing the operations herein described and other operations. For example, electronic device 100 can include electrical power functional blocks or devices, human interface functional blocks or devices (e.g., displays, touch sensitive input elements, speakers, etc.), input-output functional blocks or devices, etc.

Electronic device 100 can be, or can be included in, any electronic device that performs computational operations. For example, electronic device 100 can be, or can be included in, desktop computers, laptop computers, wearable electronic devices, tablet computers, smart phones, servers, artificial intelligence apparatuses, virtual or augmented reality equipment, network appliances, toys, audio-visual equipment, home appliances, controllers, vehicles, etc., and/or combinations thereof. In some embodiments, electronic device 100 is included on one or more semiconductor chips. For example, in some embodiments, electronic device 100 is entirely included in a single "system on a chip" (SOC) semiconductor chip, is included on one or more ASICs, etc.

Memory

Figure 2:
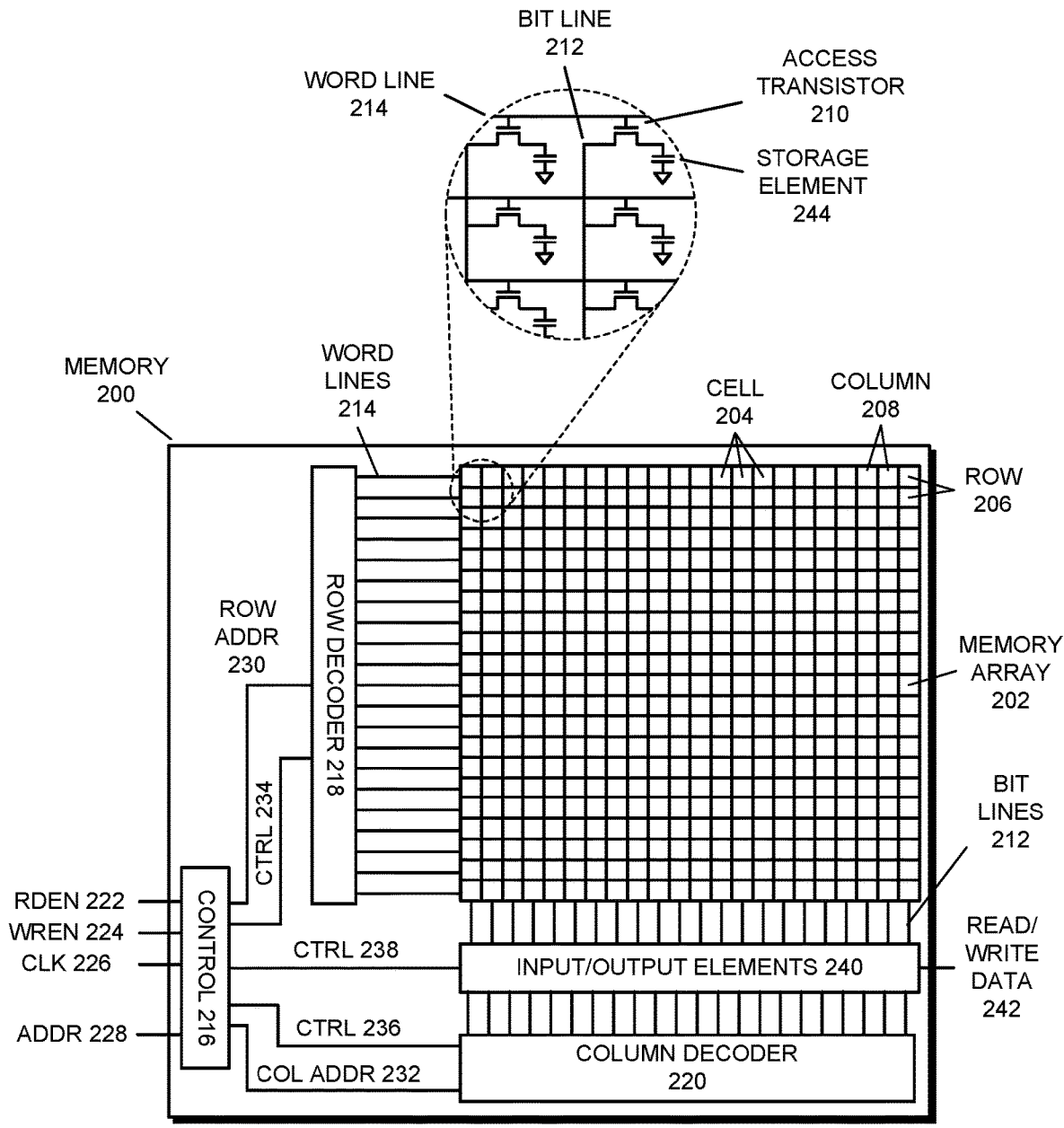
FIG. 2 presents a block diagram illustrating a memory in accordance with some embodiments.

As described above, memory 104 is a functional block that includes memory circuitry for storing data and control circuitry for accessing data stored in the memory circuitry. FIG. 2 presents a block diagram illustrating memory 200 in accordance with some embodiments. In some embodiments, memory 104 is arranged similarly to memory 200—and thus includes similar internal elements.

The memory circuitry in memory 200 is included in memory array 202. Memory array 202 is a functional block that includes dynamic random access memory (DRAM) cells 204—or "bit cells"—organized into rows 206 and columns 208 (only a few of which are labeled in FIG. 2 for clarity). In some embodiments, the cells 204 in memory array 202 are implemented using fifth generation double data rate synchronous dynamic random access memory (DDR5 DRAM).

A few of the cells 204 in memory array 202 are shown in an expanded view above memory 200. As can be seen in the expanded view, each cell 204 includes a storage element 244 (i.e., a capacitor) for storing a bit of data. Each cell 204 also includes an access transistor 210 for accessing the bit of data stored in storage element 244. A source input of access transistor 210 in each cell 204 is connected to a bit line 206 and a drain input is connected to storage element 244 (or vice versa). A gate input of access transistor 210 in each cell is connected to a word line 410, with some or all of the cells in each row 206 being connected to a same word line 410. For writing data to a cell 204, a bit of data is provided on a respective bit line 212 and the access transistor 210 is enabled using the respective word line 214 providing access to the storage element 244, where the data is stored. For reading data from a cell, the access transistor 210 is enabled using the respective word line 214 providing access to the storage element 244 and the data in the storage element 244 is exposed to the respective bit line 212.

The control circuitry in memory 200 includes control 216, row decoder 218, and column decoder 220. Control 216 receives, from an external source (e.g., a memory controller such as memory controller 106, a system clock generator (not shown), etc.), read enable (RDEN) 222, write enable (WREN) 224, clock (CLK) 226, and address (ADDR) 228. Read enable 222 is a signal that is asserted for enabling a read operation (i.e., a read memory access) and write enable 224 is a signal that is asserted for enabling a write operation (i.e., a write memory access). Clock 226 is a control signal that is used for synchronizing operations (e.g., read/write operations, etc.) in memory 200. Address 228 is a signal for determining the rows and columns to be accessed in memory array 202 for a given memory access. From read enable 222, write enable 224, clock 226, and/or address 228, control 216 generates and/or forwards row address (ADDR) 230, which identifies a row in memory array 202 to be accessed, column address (COL ADDR) 232, which identifies columns to be accessed, and control (CTRL) 234-236, which control when and how row decoder 218 and column decoder 220 operate.

In addition to the memory and control circuitry, memory 200 includes input/output elements 240, which are circuit elements (e.g., sense amplifiers, multiplexers, latches, etc.) that receive write data 242 to be stored in memory array 202 for a write request and/or read data 242 that is read from memory array 202 to be provided to an external receiver (e.g., a memory controller such as memory controller 106) for a read request. For example, in some embodiments, input/output elements 240 includes write drivers that drive bits of data to be stored in a given row 206 in memory array onto respective bit lines, from where the data is stored in storage elements 244 in cells 204 in the given row. As another example, in some embodiments, input/output elements 240 include a row buffer into which data read from rows 206 is temporarily stored to be provided to external receivers (e.g., in 64 byte chunks of a 4 KiB row buffer). In some embodiments, reads are "destructive," and thus the data stored in cells is lost in the cells themselves as the data is read. The data, however, stored in the row buffer for a read operation is eventually re-written/restored to the cells 204 in the row 206 from where the data was read.

In some embodiments, control 216 (and/or other functional blocks, e.g., memory controller 106) perform DRAM refreshes. Generally, due to the small size of storage elements 244 in memory array 202, the storage elements 244 gradually lose electrical charge. The data stored in storage elements 244 therefore becomes unreliable unless periodically rewritten, or refreshed, in the storage elements 244. For a DRAM refresh, control 216 causes existing data to be read from some or all of the cells 204 in a row 206, stored in a row buffer (or simply looped back to the cells 204), and rewritten to the cells 204, which restores the storage elements 244 in the cells 204 to a stronger electrical charge. In some cases, the DRAM refreshes are performed regularly in order to avoid the loss of data. In some embodiments, memory refresh functional block 110 (and/or other functional blocks) perform a similar type of refreshing to refresh data in individual victim rows that may be experiencing row hammering attacks as described herein.

Although memory 200 is shown as including a particular number and arrangement of elements, in some embodiments, memory 200 includes a different number of elements and/or is differently arranged. For example, in some embodiments, memory array 202 includes a different number of cells 204, rows 206, and/or columns 208. For instance, in some embodiments, memory array 202 includes N rows 206, each row 206 including sufficient cells for storing Mbytes of data (e.g., N=262,144 and M=8 kiB). As another example, although not shown in FIG. 2, in some embodiments, memory 200 includes precharge and/or discharge circuitry that precharges and/or discharges bit lines 212 for write and/or read operations. Generally, memory 200 includes sufficient elements to perform the operations described herein.

Victim Memory Rows

Figure 3:
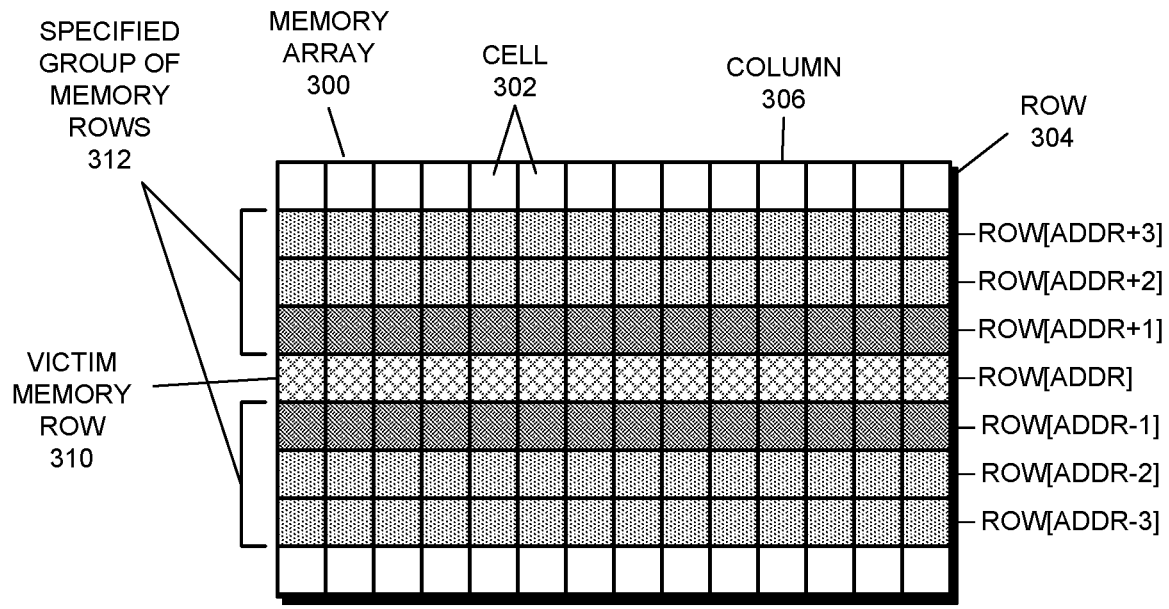
FIG. 3 presents a block diagram illustrating a set of memory rows including a victim memory row in accordance with some embodiments.

In the described embodiments, a victim row refresh operation is performed to protect the data in victim memory rows from row hammering attacks. FIG. 3 presents a block diagram illustrating a number of memory rows including victim memory row 310 in accordance with some embodiments. In some embodiments, memory array 300, cells 302, rows 304, and columns 306 as shown in FIG. 3 have similar properties and characteristics to memory array 202, cells 204, row 206, and column 208, respectively, and thus are not again described for FIG. 3. Memory array 300 is shown with a limited number of cells 302, rows 304, and columns 306 for illustrative purposes; in some embodiments, memory array 300 includes more cells 302, rows 304, and/or columns 306. In addition, only some of the cells, rows, and columns in FIG. 3 are labeled for clarity.

In FIG. 3, victim memory row 310 is shown as a memory row in the middle part of memory array 300. On either side of—i.e., above and below—victim memory row 310 are a number of other rows 304, which are identified via their memory addresses relative to victim memory row 310. As can be seen, victim memory row 310 is located at memory address ADDR. Generally, ADDR is an example of a memory address within an address space for the memory (e.g., memory 104) in which memory array 300 is located, such as a 16 hex-digit address in a 64 bit architecture. There are three labeled memory rows above victim memory row 310, with an adjacent/directly neighboring memory row labeled as ADDR+1, where ADDR+1 is the address of victim memory row 310 plus one row. For example, assuming 8 KiB rows, if victim memory row 310 is located at address B, then the adjacent/directly neighboring memory row is located at address B+8 KiB. The remaining memory rows above victim memory row 310 are labeled as ADDR+2 and ADDR+3, respectively. In a similar way, memory rows below victim memory row 310 are labeled ADDR−1 for the adjacent/directly neighboring memory row, and ADDR−2 and ADDR−3 for the memory rows further away from victim memory row 310.

A row hammering attack includes a malicious entity repeatedly writing data to some or all of the memory rows near victim memory row 310. For example, in some embodiments, a malicious entity may repeatedly write data to some or all of the memory rows in specified group of memory rows 312 that includes the three rows above victim memory row 310 (ADDR+1, ADDR+2, and ADDR+3) and the three memory rows below victim memory row 310 (ADDR−1, ADDR−2, and ADDR−3). In other words, the malicious entity will cause the memory (e.g., via corresponding memory access requests) to write one or more values or patterns of data into some or all of the storage elements (e.g., storage elements 244) in some of all of the memory rows in the specified group of memory rows 312. For example, in an attempt to drain electrical charge from the storage elements in victim memory row 310 and thereby to change stored ones/logical high values (e.g., approximately VDD) to zeroes/logical low values (e.g., approximately VSS), the malicious entity may repeatedly write zeros/logical low values to some or all of the memory rows in specified group of memory rows 312. Due to their proximity to victim memory row 310, repeatedly writing data to the adjacent/directly neighboring memory rows (i.e., ADDR+1 and ADDR−1) has the most effect on data stored in victim memory row 310—and thus may result in alterations of the data in victim memory row 310 with a smaller number of repeated writes. Writing data to the other memory rows in the specified group of memory rows 312, however, can also have an effect on data stored in victim memory row 310, albeit requiring a larger number of repeated writes.

For the example in FIG. 3, the specified group of memory rows 312 is assumed to be three memory rows. For memory rows beyond three memory rows away from victim memory row 310, therefore, it is assumed that repeated writes will have little or no effect on data stored in victim memory row 310—and/or that typical DRAM refreshes are sufficient to protect the data stored in victim memory row 310. Generally, the number of memory rows that can be used for a row hammering attack is dictated by a semiconductor process in which memory array 300 is fabricated and/or operational characteristics of memory array 300. For example, in some embodiments, semiconductor processes having smaller feature sizes/storage elements and cells located more closely, memory accesses in a larger number of nearby rows can have an effect on a victim memory row and thus the number of rows in the specified group of memory rows 312 should be higher. As another example, in some embodiments, for higher operating voltages, currents, frequencies, etc., memory accesses in a larger number of nearby rows can have an effect on a victim memory row and thus the number of rows in the specified group of memory rows 312 should be higher. As described herein, memory accesses in the specified group of memory rows 312 are used for determining whether a row hammering attack may be happening and/or if a sufficiently large number of repeated memory accesses in memory rows has occurred to warrant refreshing a victim memory row.

Refresh Window

In some embodiments, a refresh window is used for actions relating to victim row refresh operations. A refresh window is an interval of time at the end of which—or at least once during which—actions for a victim row refresh operation are performed. For example, in some embodiments, the refresh window is K ms in length (where K=128, 250, or another value) and the victim row refresh operation is commenced at the end of each refresh window. In some embodiments, refresh windows repeat one or more times—and may repeat for as long as memory accesses are occurring during operation. For example, in some embodiments, a first K ms refresh window starts at a given time (e.g., at or near startup of the memory, following a first memory access, etc.) and then subsequent K ms refresh windows follow the first refresh window in sequence. In some of these embodiments, the actions for a victim row refresh operation are performed for each refresh window—and thus are periodically repeated.

Memory Access Count Record

In some embodiments, one or more functional blocks in an electronic device (e.g., memory refresh functional block 110) keep a record of memory accesses that is used for victim row refresh operations. Generally, the record of memory accesses includes information about memory rows in a memory (or other portions of memory) that have been accessed. For keeping the record of memory accesses, the one or more functional blocks record information about memory accesses in memory rows in the memory access count record. The memory refresh functional block (and/or another functional block) then acquires information about memory rows that have been accessed from the record of memory accesses and uses the information for identifying victim memory rows as described herein.

Figure 4:
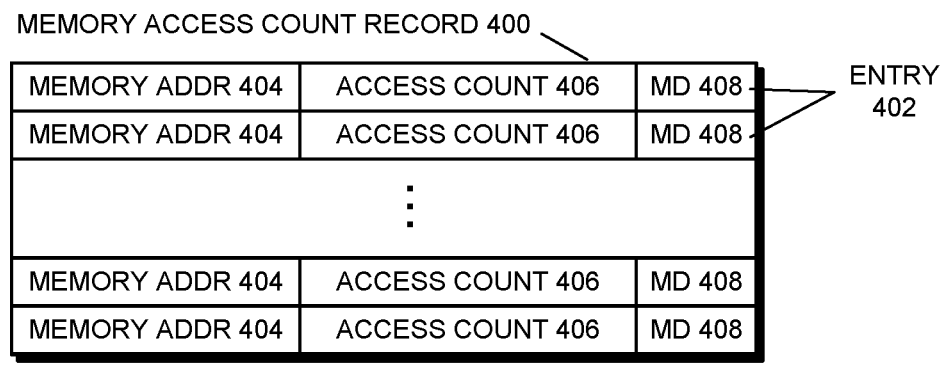
FIG. 4 presents a block diagram illustrating a memory access count record in accordance with some embodiments.

In some embodiments, the record of memory accesses is or includes a memory access count record. FIG. 4 presents a block diagram illustrating a memory access count record 400 in accordance with some embodiments. As can be seen in FIG. 4, memory access count record 400 includes a number of entries 402 (only two of which are labeled for clarity), each entry 402 being usable for storing information about a memory row that has been accessed. The information in each entry 402 includes a memory address (ADDR) 404, an access count 406, and metadata (MD) 408. Memory address 404 is used for storing information for identifying a memory row for which the entry 402 holds access information. For example, in some embodiments, memory address 404 includes some or all of a memory address associated with the memory row—or a value computed or generated based thereon. Access count 406 includes information for identifying a number of memory accesses to the memory row. For example, in some embodiments, access count 406 includes a C bit saturating counter (where C=16, 30, or another number). Metadata 408 includes information about the entry 402 itself (e.g., valid bit(s), time stamps, etc.), the memory row for which the entry holds information (e.g., accessing entity identifiers, memory status, etc.), and/or the accesses (e.g., access type, size of data accessed, etc.).

Figure 5:
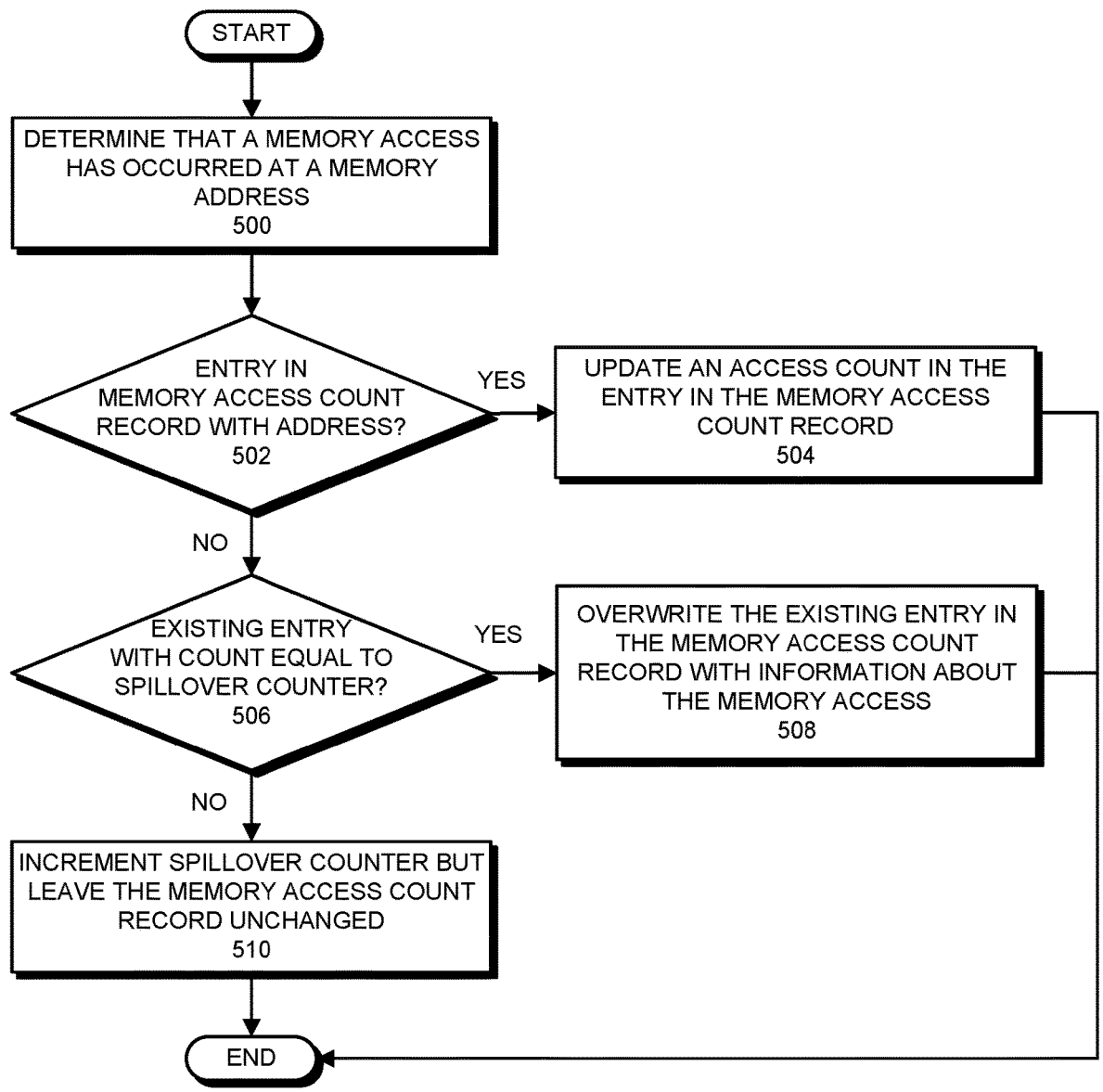
FIG. 5 presents a block diagram illustrating a process for updating information in a memory access count record in accordance with some embodiments.

In some embodiments, in order to avoid the need for storing a large memory access count record 400, memory access count record 400 includes fewer entries 402 than there are memory rows. For example, in some embodiments, there are 262,144 memory rows, but only 128 entries 402 in memory access count record 400. In these embodiments, it is not possible for memory access count record 400 to simultaneously store information about accesses in every memory row—or even a significant percentage of the memory rows. In these embodiments, therefore, the entries 402 are managed (e.g., by the memory refresh functional block) in such a way as to assist in keeping current and useful information in memory access count record 400. Hence, when all of the entries 402 in memory access count record 400 are full and new information is to be stored in memory access count record 400, existing information may be overwritten (or "evicted") from an entry 402. FIG. 5 presents a block diagram illustrating a process for updating information in memory access count record 400 in accordance with some embodiments. FIG. 5 is presented as a general example of operations performed in some embodiments. In other embodiments, however, different operations are performed and/or operations are performed in a different order. Additionally, although certain elements are used in describing the process (e.g., a memory refresh functional block, etc.), in some embodiments, other elements perform the operations. Also, for the operations in FIG. 5, it is assumed that all entries 402 in memory access count record 400 are full, i.e., store existing information about memory rows that have been accessed. If all entries 402 were not full, an available entry 402 could simply be updated when the memory access shown in step 500 occurs.

The process shown in FIG. 5 starts when a memory refresh functional block (or another functional block) determines that a memory access has occurred at a memory address (step 500). For example, the memory refresh functional block itself can detect the memory access while snooping memory accesses on a memory bus. As another example, another functional block (e.g., memory controller 106, processor 102, etc.) can communicate information about a memory access to the memory refresh functional block.

The memory refresh functional block then determines whether there is an existing entry 402 in memory access count record 400 with the memory address (step 502). During this operation, the memory refresh functional block determines if an entry 402 already includes memory access information previously added to the memory access count record 400 after an earlier memory access of the same memory address. If such an entry exists, the memory refresh functional block updates (e.g., increments, increases, etc.) the access count 406 for the entry 402 (step 504). For example, in some embodiments, the memory refresh functional block increments a saturating counter in the access count 406. In this way, the memory refresh functional block records that an additional memory access has occurred for the memory row at the memory address. After the access count 406 in the entry 402 is updated, the process ends.

When there is no existing entry 402 in memory access count record 400 with the memory address (step 502), the memory refresh functional block determines if there is an entry 402 for which an access count 406 is equal to a spillover counter (step 506). When there is such an entry 402, the memory refresh functional block overwrites that entry 402 with information about the memory access (step 508). Generally, for this operation, the memory refresh functional block uses the spillover counter (which is kept as otherwise shown in FIG. 5) to determine when an entry 402 should be evicted/overwritten due to a number of other memory rows having been accessed without an access of a memory row for which the entry 402 holds information. For overwriting the entry 402, in some embodiments, the memory refresh functional block updates an existing memory address 404 in the entry 402 with the memory address from the memory access and updates metadata 408 accordingly. In some embodiments, the memory refresh functional block also updates the existing access count 406 for the entry 402 by incrementing the existing access count 406 in the entry 402 by one (i.e., and not setting the access count to one). In this way, the existing access count 406 for the entry 402 is carried over, albeit adjusted/incremented, associated with the new information in the entry 402. After the existing entry 402 is overwritten, the process ends.

When there is no existing entry 402 in memory access count record 400 with the memory address (step 502) and no entry 402 with an access count 406 equal to the spillover counter (step 506), the memory refresh functional block increments (or otherwise increases) the spillover counter but leaves memory access count record 400 unchanged (step 510). In other words, the memory refresh functional block does not record information about the memory access in memory access count record 400—thereby ignoring the memory access with regard to updates to memory access count record 400. The memory refresh functional block updates the spillover counter, however, in order to record and identify the number of memory accesses that have been ignored with regard to updates to memory access count record 400. By updating the spillover counter, the memory refresh functional block keeps/maintains the spillover counter for use in step 506. After the spillover counter is incremented, the process ends.

Returning to FIG. 4, in some embodiments, the number of entries 402 in memory access count record 400 is determined based on one or more properties of the memory and/or operational characteristics of the memory. For example, in some embodiments, the number of entries is determined based on a maximum number of memory accesses that can occur in a refresh window ("accesses") and an access threshold ("threshold"). In some of these embodiments, the formula used for computing the number of entries is: Number of entries>(Accesses/Threshold)−1.

In some embodiments, some or all of the entries 402 in memory access count record 400 are occasionally cleared or reset to an initial state. In other words, the memory address 404, access count 406, and metadata 408 in each entry 402 are deleted and/or set to initial or default values, which restores memory access count record 400 (or at least some of the entries 402) to an initial state. For example, in some embodiments, some or all of the entries 402 in memory access count record 400 are cleared or reset to the initial state at least once during each refresh window. For example, in some embodiments, all of the entries 402 in memory access count record 400 are cleared or reset after memory access count record 400 is used for identifying a victim row during a victim row refresh operation as described herein. In this way, memory access count record 400 is reset/cleared to restart the counts of memory accesses for each victim row refresh operation. In embodiments in which one victim row refresh operation is performed per refresh window, therefore, memory access count record 400 is cleared following the victim row refresh operation in each refresh window in order to prepare memory access count record 400 for a next victim row refresh operation in a next refresh window.

In some embodiments, the memory refresh functional block (or another functional block) sorts the memory access count record 400 for one or more operations. For example, the memory refresh functional block can sort the memory access count record 400 for a victim row refresh operation as described, e.g., for step 602 in FIG. 6. In some of these embodiments, for the sorting, the memory refresh functional block physically moves information in the entries 402 in memory access count record 400 to arrange the entries 402 into a sorted order (assuming that the entries 402 are not already in the sorted order). For example, the sorted order may have an entry 402 with the highest access count 406 in a given location in memory access count record 400 and the remaining entries 402 in subsequent other locations in memory access count record 400 in order based on their access counts 406. In some of these embodiments, however, memory access count record 400 is associated with one or more separate references to respective entries 402 and the references are sorted rather than the information in entries 402. For example, the references may include pointer arrays, tag arrays, lists, etc. that can be sorted.

In some embodiments, the above-described sorting of memory access count record 400 is performed dynamically or on the fly so that memory access count record 400 is kept substantially sorted for victim row refresh operations (i.e., is generally sorted except during the brief periods of time when the sort operations themselves are being performed). In other embodiments, the sorting is performed as needed, e.g., when a victim row refresh operation is commenced— and may be triggered at specified times (e.g., the beginning or end of a refresh window, by particular events, etc.). In some embodiments, the sorting is partial, with only a selected number of entries kept in a sorted order and the remaining entries kept in any convenient order (e.g., a random order, etc.). For example, assuming that memory access count record 400 includes 256 entries, the top 32 entries can be sorted.

Although a particular arrangement and type of information is shown in memory access count record 400, in some embodiments, different information is present. Generally, memory access count record 400 includes sufficient information to perform the operations herein described. In addition, although embodiments are described in which information about memory rows is kept in memory access count record 400, in some embodiments, memory access count record 400 includes information about other portions of memory.

Process for Performing a Victim Row Refresh Operation

Figure 6:
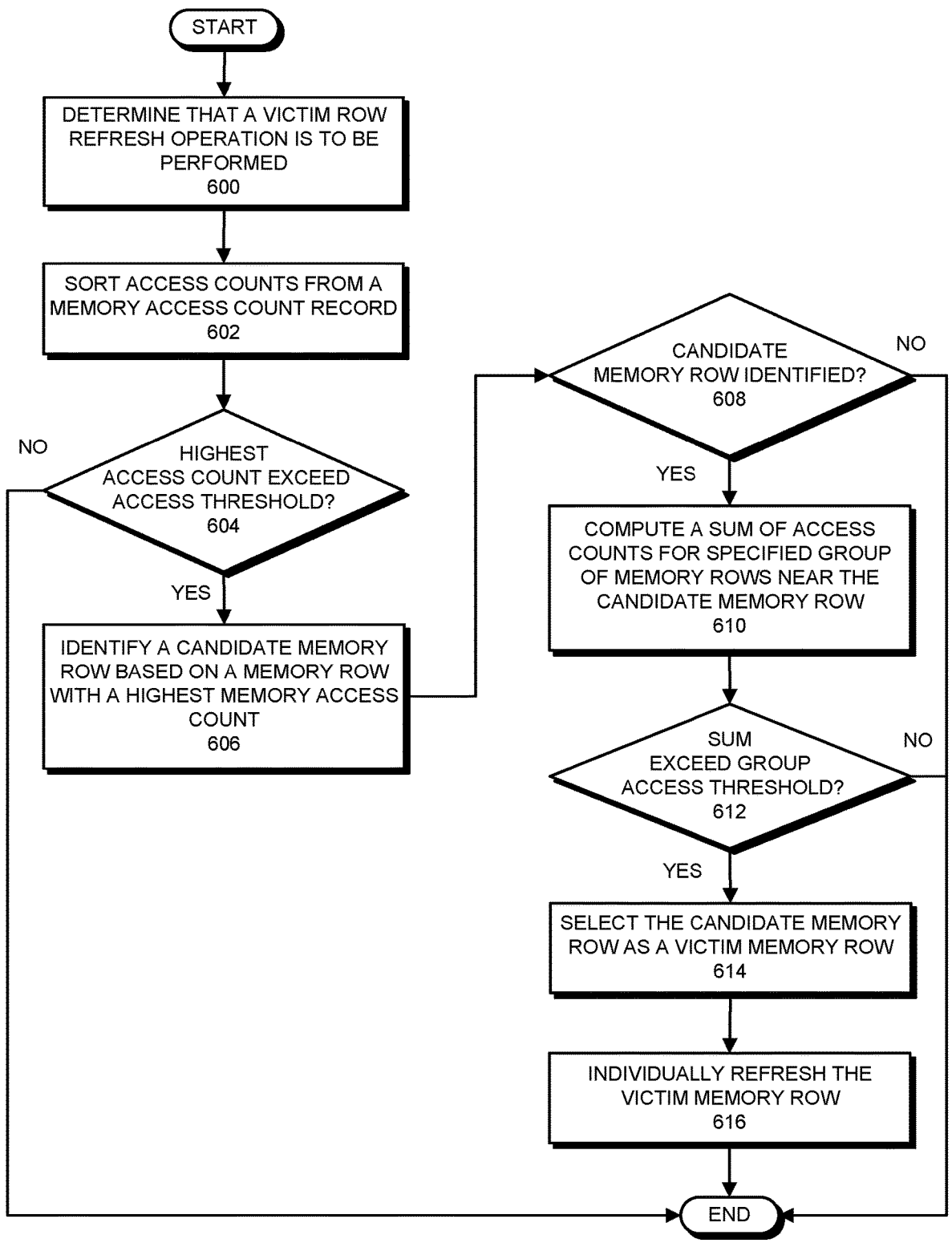
FIG. 6 presents a flowchart illustrating a process for performing a victim row refresh operation in accordance with some embodiments.

In the described embodiments, functional blocks in an electronic device (e.g., electronic device 100) perform a victim row refresh operation for protecting data in victim memory rows in a memory (e.g., victim memory row 310) from row hammering attacks. For the victim row refresh operation, a memory refresh functional block (e.g., memory refresh functional block 110) in the electronic device selects victim memory rows that may be experiencing row hammering attacks and then individually refreshes the victim memory rows in order to protect the memory rows from the possible row hammering attacks. FIG. 6 presents a flowchart illustrating a process for performing a victim row refresh operation in accordance with some embodiments. FIG. 6 is presented as a general example of operations performed in some embodiments. In other embodiments, however, different operations are performed and/or operations are performed in a different order. Additionally, although certain elements are used in describing the process (e.g., a memory refresh functional block, etc.), in some embodiments, other elements perform the operations. For example, in some embodiments, the memory itself includes a functional block that performs the operations, the processor 102 performs some or all of the operations, etc.

For the process in FIG. 6, only an entry with a highest access count in the memory access count record (e.g., a highest access count 406 that exists in an entry 402 in memory access count record 400) is used for the victim row refresh operation. In other words, only the single entry in the memory access count record with the highest access count is used for the operations shown in FIG. 6. In some embodiments, however, more than one entry is used during the victim row refresh operation. For example, the B entries in the memory access count record having the highest access counts may be used for the victim row refresh operation, where B=3, 6, or another number. In these embodiments, the operations of FIG. 6 are similar, although applying to each of the B entries in the memory access count record. That is, some or all of steps 604-616 are separately performed using/based on an access count from each of the B entries. As another example, in some embodiments, all memory rows for which the access counts are greater than the access threshold may be used for the victim row refresh operation. In these embodiments, the operations of FIG. 6 are similar, although applying to each of the entries in the memory access count record—and adding a check in the memory access count record for finding memory rows for which the access counts are greater than the access threshold.

For the process in FIG. 6, entries in the memory access count record are sorted based on their access counts as part of the victim row refresh operation. In some embodiments, however, the entries in the memory access count record are not sorted for the victim row refresh operation, but instead are used as they are found in the memory access count record at the commencement of the victim row refresh operation. For example, a comparison operation may be used on the unsorted memory access count record to find the entry with the highest access count. Alternatively, the entries in the memory access count record may be dynamically sorted during operations before the victim row refresh operation. In these embodiments, the entries are already in sorted order and a separate sorting operation is not needed.

For the process in FIG. 6, a memory refresh functional block performs a single victim row refresh operation—i.e., performs only the one victim row refresh operation at a particular time. In some embodiments, the memory refresh functional block performs a victim row refresh operation similar to the victim row refresh operation in FIG. 6 at each of two or more times. For example, in some embodiments, a victim row refresh operation is performed at the end (or another part of) of each refresh window in a sequence of refresh windows. As another example, in some embodiments, victim row refresh operations are performed when specified event(s) occur. For instance, the specified event(s) can include events such as when one or more given memory locations are accessed, when more than a specified number of memory accesses have occurred, when memory accesses are occurring at more than a given rate, when a software application is repeatedly writing to memory or writing to a limited number of locations in memory, etc. In these embodiments, therefore, the memory refresh functional block can perform victim row refresh operations regularly/periodically or irregularly while the electronic device operates.

The process shown in FIG. 6 starts when the memory refresh functional block determines that a victim row refresh operation is to be performed (step 600). For this operation, the memory refresh functional block itself determines that a victim row refresh operation is to be performed or receives an indication from another functional block (e.g., processor 102, memory controller 108, etc.) that the victim row refresh operation is to be performed. For example, in some embodiments, the memory refresh functional block determines that the victim row refresh operation is to be performed upon reaching the end (or another part) of a refresh window. As another example, in some embodiments, the memory refresh functional block monitors memory accesses and determines that the victim row refresh operation is to be performed when a specified number of memory accesses have occurred. As yet another example, in some embodiments, the memory refresh functional block determines that a victim row refresh operation should be performed when a given event has occurred and/or a particular time has passed since a given event occurred (e.g., a particular workload or phase thereof commenced execution, a software application started execution, etc.). As yet another example, in some embodiments, the memory refresh functional block determines that the victim row refresh operation should be performed upon receiving a request (e.g., a message, signal on a dedicated signal line, etc.) from another functional block indicating that the victim row refresh operation should be performed. In these embodiments, the other functional block may monitor memory accesses, events, etc. and determine that the victim row refresh operation should be performed before communicating a request to the memory refresh functional block.

In some embodiments, the memory refresh functional block then sorts memory access counts from a memory access count record (step 602). For this operation, the memory refresh functional block sorts the entries in the memory access count record based on the relative size/value of the access count in each of the entries so that the entries are sorted from an entry with a highest access count to an entry with a lowest access count. In some embodiments, for the sorting, the memory refresh functional block physically moves/reorders information in the entries in the memory access count record. In other words, in these embodiments, when the sorting is completed, the information in the entries is arranged so that a specified entry (e.g., a top or first entry) in the memory access count record stores the highest access count and subsequent (e.g., lower or second, third, etc. entries) store subsequent lower access counts in relative size order. In some embodiments, however, the memory access count record includes a reference (e.g., a pointer array, a list, etc.) and the sorting involves sorting the reference—or generating a representation of a sorted order for the entries. In these embodiments, the information in the entries in the memory access count record is not itself moved during the sorting, although information in the reference may be moved/relocated. In addition, in these embodiments, the reference is subsequently used to determine the entry in the memory access count record with the highest access count.

After the access counts are sorted, the memory refresh functional block determines whether a highest access count exceeds an access threshold (step 604). For this operation, the memory refresh functional block acquires the highest access count from the sorted memory access count record. The memory refresh functional block then compares the highest access count to the access threshold (e.g., 5000, 10000, or another number of accesses), to determine if the highest access count exceeds the access threshold. Generally, the access threshold represents a number of memory accesses in a memory row that is sufficient to render worthwhile further checks for a row hammering attack. In other words, the access threshold represents a number of memory accesses in a memory row above which it is judged that a row hammering attack may be occurring—and thus subsequent operations in the victim row refresh operation should be performed. The access threshold can be set experimentally, based on estimates, based on memory access patterns observed in other row hammering attacks, and/or based on other information. When the highest access count does not exceed the access threshold (step 604), the victim row refresh operation ends. In other words, the memory refresh functional block halts the victim row refresh operation without selecting and/or refreshing any victim memory row.

When the highest access count exceeds the access threshold (step 604), the memory refresh functional block identifies a candidate memory row based on the memory row with the highest access count (step 606). For this operation, the memory refresh functional block acquires the memory address from the entry in the memory access count record with the highest access count. The memory refresh functional block then determines a candidate memory row that is adjacent to the memory row at the memory address (where the "candidate" memory row is a memory row that may eventually be selected as a victim memory row in steps 612-614). Using FIG. 3 as an example, the memory refresh functional block would identify victim memory row 310 as a candidate memory row when the access count for memory row ADDR−1 (or ADDR+1) exceeds the access threshold— i.e., a memory row that directly neighbors victim memory row 310. If a candidate memory row cannot be identified (step 608), the victim row refresh operation ends. In other words, the memory refresh functional block halts the victim row refresh operation without refreshing a victim memory row.

After identifying a candidate memory row (step 608), the memory refresh functional block computes a sum of access counts for a specified group of memory rows near the candidate memory row (step 610). Generally, for this operation, the memory refresh functional block adds access counts from the memory access count record for nearby memory rows on one or more sides of the candidate memory row in order to determine if sufficient memory accesses have occurred in the specified group of memory rows to justify determining that a row hammering attack is being made on the candidate memory row. Recall that the specified group of memory rows includes memory rows that are sufficiently close to the candidate memory row (i.e., in the physical layout memory circuitry in the memory) that repeated accesses of these memory rows may alter data in the candidate memory row. Using FIG. 3 as an example, for victim memory row 310 (which is the candidate memory row for the purposes of this example), the specified group of memory rows includes memory rows located from ADDR−3 to ADDR−1 and ADDR+1 to ADDR+3, but not the other memory rows in FIG. 3. For step 610, therefore, access counts for some or all of the memory rows in memory rows memory rows ADDR−3 to ADDR−1 and ADDR+1 to ADDR+3 are summed.

In some cases, some of the memory rows in the specified group of memory rows for step 610 may have experienced a low number of memory accesses or no memory accesses at all—and therefore may contribute little or nothing to the sum of access counts. For example, and continuing the example from FIG. 3, the memory row located at ADDR+1 may have a relatively large number of memory accesses, while the memory rows located at ADDR−3 to ADDR−1 and ADDR+2 to ADDR+3 may have relatively few memory accesses. This is true because a row hammering attack can be made using less than all the rows in the specified group of memory rows—and can in some cases be made using only a single memory row. In some cases, memory rows in the specified group of memory rows that have experienced no accesses or a lower number of memory accesses may not have corresponding records in the memory access count record. When there is no record for a memory row in the memory access count record, that memory row contributes nothing to the summation of access counts in step 610.

The memory refresh functional block then checks whether the sum of the access counts for the specified group of memory rows exceeds a group access threshold (step 612). Generally, for this operation, the memory refresh functional block determines, based on the memory accesses that have occurred in the specified group of memory rows, whether a row hammering attack may be occurring for the candidate memory row. In other words, the memory refresh functional block compares the sum of memory accesses for the memory rows in the specified group of memory rows to a group access threshold (e.g., 30000, 50000, or another number of accesses) that identifies the candidate memory row as possibly being under a row hammering attack. The memory refresh functional block determines whether a row hammering attack may be underway based on the outcome of the comparison. The group access threshold can be set experimentally, based on estimates, and/or based on memory access patterns observed in other row hammering attacks. When the sum of the access counts does not exceed the group access threshold (step 612), the victim row refresh operation ends. In other words, the memory refresh functional block halts the victim row refresh operation without refreshing a victim memory row.

When the sum of access counts for the specified group of memory rows exceeds the group access threshold (step 612), the memory refresh functional block selects the candidate memory row as a victim memory row (step 614). For this operation, the memory refresh functional block, based on the highest access count for the adjacent memory row exceeding the access threshold in step 604 and the sum of the access counts for the specified group of memory rows exceeding the group access threshold in step 612, determines that the candidate row may be experiencing a row hammering attack. The memory refresh functional block therefore identifies the candidate memory row as a victim memory row.

The memory refresh functional block then individually refreshes the victim memory row (step 616). For this operation, the memory refresh functional block causes data stored in memory elements in the victim memory row to be recharged or otherwise restored so that existing data stored in the victim memory row is retained in the memory elements. Continuing the example in FIG. 2, where data is stored in capacitive storage elements 244 in memory rows 206, recharging the data means reading data from the capacitive storage elements 244 into a row buffer and then writing the data back from the row buffer into the capacitive storage elements 244. In some embodiments, the memory refresh functional block uses existing refresh circuitry to recharge or otherwise restore the data. After step 616, the data stored in the victim memory row is substantially at a full electrical charge or is otherwise restored—and is less likely to succumb to the possible row hammering attack.

Note that, for FIG. 6, the memory refresh functional block determines that a row hammering attack "may be" occurring for the victim memory row. This is true because the memory accesses are not necessarily being used for a row hammering attack—i.e., may be legitimate memory accesses. In other words, in some embodiments, an assumption is made that a row hammering attack is occurring because memory accesses share some similarity to past row hammering attacks (as identified by the access threshold of step 604 and group access threshold of step 612). Assuming that a row hammering attack is occurring and refreshing of the victim memory row when a row hammering attack is not occurring in this way can be a minor inefficiency, but does not affect the correct operation of the memory. This is true because the data in the victim memory row is simply refreshed.

The victim refresh operation shown in FIG. 6 differs in at least two ways from existing systems. Generally, in existing systems, multiple memory rows near memory rows suspected of being under a row hammering attack are refreshed as a group. For example, in existing systems, four rows on either side of a victim row in a memory array may be refreshed when the victim row is suspected of being under a row hammering attack. The first difference is that, by performing the above-described pair of checks (i.e., against the access threshold and the group access threshold), the described embodiments provide better assessments of possible row hammering attacks by ensuring that accesses deliberately spread by a malicious entity among several memory rows are noticed. This is in contrast to simply responding to a large number of accesses in a given/single memory row as in existing systems. The second difference is that the described embodiments identify victim memory rows themselves and individually refresh the victim memory rows. This is in contrast to existing systems in which groups of memory rows near repeatedly accessed memory rows are refreshed as a group.

In some embodiments, at least one electronic device (e.g., electronic device 100, etc.) uses code and/or data stored on a non-transitory computer-readable storage medium to perform some or all of the operations described herein. More specifically, the at least one electronic device reads code and/or data from the computer-readable storage medium and executes the code and/or uses the data when performing the described operations. A computer-readable storage medium can be any device, medium, or combination thereof that stores code and/or data for use by an electronic device. For example, the computer-readable storage medium can include, but is not limited to, volatile and/or non-volatile memory, including flash memory, random access memory (e.g., eDRAM, RAM, SRAM, DRAM, DDRS DRAM, etc.), non-volatile RAM (e.g., phase change memory, ferroelectric random access memory, spin-transfer torque random access memory, magnetoresistive random access memory, etc.), read-only memory (ROM), and/or magnetic or optical storage mediums (e.g., disk drives, magnetic tape, CDs, DVDs, etc.).

In some embodiments, one or more hardware modules perform the operations described herein. For example, the hardware modules can include, but are not limited to, one or more central processing units (CPUs)/CPU cores, graphics processing units (GPUs)/GPU cores, application-specific integrated circuit (ASIC) chips, field-programmable gate arrays (FPGAs), compressors or encoders, encryption functional blocks, compute units, embedded processors, accelerated processing units (APUs), controllers, requesters, completers, network communication links, and/or other functional blocks. When circuitry (e.g., integrated circuit elements, discrete circuit elements, etc.) in such hardware modules is activated, the circuitry performs some or all of the operations. In some embodiments, the hardware modules include general purpose circuitry such as execution pipelines, compute or processing units, etc. that, upon executing instructions (e.g., program code, firmware, etc.), performs the operations. In some embodiments, the hardware modules include purpose-specific or dedicated circuitry that performs the operations "in hardware" and without executing instructions.

In some embodiments, a data structure representative of some or all of the functional blocks and circuit elements described herein (e.g., electronic device 100, or some portion thereof) is stored on a non-transitory computer-readable storage medium that includes a database or other data structure which can be read by an electronic device and used, directly or indirectly, to fabricate hardware including the functional blocks and circuit elements. For example, the data structure may be a behavioral-level description or register-transfer level (RTL) description of the hardware functionality in a high-level design language (HDL) such as Verilog or VHDL. The description may be read by a synthesis tool which may synthesize the description to produce a netlist including a list of transistors/circuit elements from a synthesis library that represent the functionality of the hardware including the above-described functional blocks and circuit elements. The netlist may then be placed and routed to produce a data set describing geometric shapes to be applied to masks. The masks may then be used in various semiconductor fabrication steps to produce a semiconductor circuit or circuits (e.g., integrated circuits) corresponding to the above-described functional blocks and circuit elements. Alternatively, the database on the computer accessible storage medium may be the netlist (with or without the synthesis library) or the data set, as desired, or Graphic Data System (GDS) II data.

In this description, variables or unspecified values (i.e., general descriptions of values without particular instances of the values) are represented by letters such as N, M, and X. As used herein, despite possibly using similar letters in different locations in this description, the variables and unspecified values in each case are not necessarily the same, i.e., there may be different variable amounts and values intended for some or all of the general variables and unspecified values. In other words, particular instances of N and any other letters used to represent variables and unspecified values in this description are not necessarily related to one another.

The expression "et cetera" or "etc." as used herein is intended to present an and/or case, i.e., the equivalent of "at least one of" the elements in a list with which the etc. is associated. For example, in the statement "the electronic device performs a first operation, a second operation, etc.," the electronic device performs at least one of the first operation, the second operation, and other operations. In addition, the elements in a list associated with an etc. are merely examples from among a set of examples—and at least some of the examples may not appear in some embodiments.

The foregoing descriptions of embodiments have been presented only for purposes of illustration and description. They are not intended to be exhaustive or to limit the embodiments to the forms disclosed. Accordingly, many modifications and variations will be apparent to practitioners skilled in the art. Additionally, the above disclosure is not intended to limit the embodiments. The scope of the embodiments is defined by the appended claims.

What is claimed is:

1. An electronic device, comprising:
a memory that includes a plurality of memory rows; and
a memory refresh functional block configured to perform a victim row refresh operation that includes:
selecting one or more victim memory rows based on a summation of access counts for a specified group of two or more memory rows near each of the one or more victim memory rows exceeding a group access threshold; and
individually refreshing each of the one or more victim memory rows.

2. The electronic device of claim 1, wherein, when selecting the one or more victim memory rows, the memory refresh functional block is configured to:
find, using a memory access count record, one or more candidate memory rows that are adjacent to one or more repeatedly accessed memory rows; and
select each of the one or more candidate memory rows as a victim memory row when the summation of access counts from the memory access count record for the specified group of two or more memory rows near that candidate memory row exceeds the group access threshold.

3. The electronic device of claim 2, wherein, when finding the one or more candidate memory rows, the memory refresh functional block is configured to:
identify, using the memory access count record, one or more repeatedly accessed memory rows for which a respective access count exceeds an access threshold; and
select, as each of the one or more candidate memory rows, a memory row that is adjacent to a respective one of the repeatedly accessed memory rows.

4. The electronic device of claim 3, wherein the memory refresh functional block is configured to:
sort access counts from the memory access count record into a sorted order from highest to lowest access counts; and
use the access counts in the sorted order for identifying the one or more repeatedly accessed memory rows.

5. The electronic device of claim 4, wherein the memory refresh functional block is configured to:
find a highest access count from among access counts in the memory access count record; and
use only the highest access count for identifying a repeatedly accessed memory row.

6. The electronic device of claim 4, wherein the memory refresh functional block is configured to:
halt the victim row refresh operation without selecting any victim memory rows and/or refreshing any victim memory rows when:
no memory rows are identified for which the respective access count exceeds the row access threshold; or
none of the summations of access counts exceeds the group access threshold.

7. The electronic device of claim 3, wherein the memory refresh functional block is configured to:
update respective access counts associated with memory rows in the memory access count record based on memory accesses performed in those memory rows.

8. The electronic device of claim 1, wherein the one or more victim memory rows may be victims of data corruption caused by repeated memory accesses in the specified group of two or more memory rows near each of the one or more victim memory rows.

9. The electronic device of claim 1, wherein, when individually refreshing each of the one or more victim memory rows, the memory refresh functional block is configured to:
cause data stored in memory elements in each of the one or more victim memory rows to be recharged or restored so that existing data stored in each of the one or more victim memory rows is retained in the memory elements.

10. The electronic device of claim 1, wherein the memory refresh functional block is configured to commence a respective victim row refresh operation at each of two or more different times.

11. A memory refresh functional block configured to perform a victim row refresh operation, the victim row refresh operation comprising:
selecting one or more victim memory rows based on a summation of access counts for a specified group of two or more memory rows near each of the one or more victim memory rows exceeding a group access threshold; and
individually refreshing each of the one or more victim memory rows.

12. The memory refresh functional block of claim 11, wherein the memory refresh functional block is configured to, when selecting the one or more victim memory rows:
find, using a memory access count record, one or more candidate memory rows that are adjacent to one or more repeatedly accessed memory rows; and
select each of the one or more candidate memory rows as a victim memory row when the summation of access counts from the memory access count record for the specified group of two or more memory rows near that candidate memory row exceeds the group access threshold.

13. The memory refresh functional block of claim 12, wherein the memory refresh functional block is configured to, when finding the one or more candidate memory rows:
   identify, using the memory access count record, one or more repeatedly accessed memory rows for which a respective access count exceeds an access threshold; and
   select, as each of the one or more candidate memory rows, a memory row that is adjacent to a respective one of the repeatedly accessed memory rows.

14. The memory refresh functional block of claim 13, wherein the memory refresh functional block is configured to:
   sort access counts from the memory access count record into a sorted order from highest to lowest access counts; and
   use the access counts in the sorted order for identifying the one or more repeatedly accessed memory rows.

15. The memory refresh functional block of claim 14, wherein the memory refresh functional block is configured to:
   find a highest access count from among access counts in the memory access count record; and
   use only the highest access count for identifying a repeatedly accessed memory row.

16. The memory refresh functional block of claim 14, wherein the memory refresh functional block is configured to:
   halt the victim row refresh operation without selecting any victim memory rows and/or refreshing any victim memory rows when:
      no memory rows are identified for which the respective access count exceeds the row access threshold; or
      none of the summations of access counts exceeds the group access threshold.

17. The memory refresh functional block of claim 13, wherein the memory refresh functional block is configured to:
   update respective access counts associated with memory rows in the memory access count record based on memory accesses performed in those memory rows.

18. The memory refresh functional block of claim 11, wherein the one or more victim memory rows may be victims of data corruption caused by repeated memory accesses in the specified group of two or more memory rows near each of the one or more victim memory rows.

19. The memory refresh functional block of claim 11, wherein, when individually refreshing each of the one or more victim memory rows, the memory refresh functional block is configured to:
   cause data stored in memory elements in each of the one or more victim memory rows to be recharged or restored so that existing data stored in each of the one or more victim memory rows is retained in the memory elements.

20. The memory refresh functional block of claim 11, wherein the memory refresh functional block is configured to commence a respective victim row refresh operation at each of two or more different times.

21. A method for performing victim row refresh operation in an electronic device that includes a memory with a plurality of memory rows, the method comprising:
   selecting one or more victim memory rows based on a summation of access counts for a specified group of two or more memory rows near each of the one or more victim memory rows exceeding a group access threshold; and
   individually refreshing each of the one or more victim memory rows.

* * * * *